(12) United States Patent
Reynolds

(10) Patent No.: US 8,228,112 B2
(45) Date of Patent: Jul. 24, 2012

(54) SWITCH WITH REDUCED INSERTION LOSS

(75) Inventor: Scott Kevin Reynolds, Amawalk, NY (US)

(73) Assignee: International Business Machines Corporation, Armonk, NY (US)

( * ) Notice: Subject to any disclaimer, the term of this patent is extended or adjusted under 35 U.S.C. 154(b) by 445 days.

(21) Appl. No.: 12/123,735

(22) Filed: May 20, 2008

(65) Prior Publication Data

US 2009/0102542 A1   Apr. 23, 2009

Related U.S. Application Data

(60) Provisional application No. 60/949,685, filed on Jul. 13, 2007.

(51) Int. Cl.
*H03K 17/687* (2006.01)
(52) U.S. Cl. ........ 327/427; 327/108; 327/365; 327/403; 333/104; 333/262
(58) Field of Classification Search .................. 327/108, 327/109, 112, 365, 374, 379, 384, 391, 403, 327/404, 419, 427, 324, 426, 534, 537; 333/101, 333/103, 104, 262
See application file for complete search history.

(56) References Cited

U.S. PATENT DOCUMENTS

| | | | | |
|---|---|---|---|---|
| 4,342,001 A | * | 7/1982 | Sauer | ................................ 330/9 |
| 4,435,652 A | * | 3/1984 | Stevens | .......................... 327/541 |
| 5,079,456 A | * | 1/1992 | Kotowski et al. | ............. 327/427 |
| 5,375,256 A | * | 12/1994 | Yokoyama et al. | ............. 455/80 |
| 5,394,007 A | * | 2/1995 | Reuss et al. | .................... 257/544 |
| 5,568,044 A | * | 10/1996 | Bittner | .......................... 323/272 |
| 5,659,885 A | * | 8/1997 | McDonald et al. | ............. 455/78 |
| 5,784,687 A | * | 7/1998 | Itoh et al. | .......................... 455/78 |
| 6,340,612 B1 | * | 1/2002 | Noble et al. | .................... 438/213 |
| 6,448,842 B2 | * | 9/2002 | Zanuccoli et al. | ............ 327/536 |
| 6,469,350 B1 | | 10/2002 | Clark, Jr. et al. | |
| 6,639,450 B2 | * | 10/2003 | Dabral | .......................... 327/534 |
| 6,664,150 B2 | | 12/2003 | Clark, Jr. et al. | |
| 6,667,657 B2 | | 12/2003 | Nakatani et al. | |
| 6,882,829 B2 | * | 4/2005 | Mostov et al. | .................. 455/83 |
| 7,123,898 B2 | | 10/2006 | Burgener et al. | |
| 7,205,830 B2 | | 4/2007 | Gangasani et al. | |
| 7,414,474 B2 | * | 8/2008 | Yamada et al. | ............... 330/255 |
| 7,474,139 B2 | * | 1/2009 | Tanzawa | ....................... 327/534 |
| 7,558,334 B2 | * | 7/2009 | McCune et al. | ............... 375/297 |
| 7,728,649 B1 | * | 6/2010 | Webb et al. | .................... 327/534 |
| 2002/0041531 A1 | * | 4/2002 | Tanaka et al. | .................. 365/205 |

(Continued)

OTHER PUBLICATIONS

Z. Li et al., "A 15-GHz Integrated CMOS Switch with 21.5-dBm IP1dB and 1.8-dB Insertion Loss," VLSI Circuit Symposium Digest of Technical Papers, Jun. 2004, pp. 366-367.*

(Continued)

*Primary Examiner* — Lincoln Donovan
*Assistant Examiner* — Shikha Goyal
(74) *Attorney, Agent, or Firm* — Anne V. Dougherty; Ryan, Mason & Lewis, LLP

(57) ABSTRACT

A circuit includes an amplifier having an input and an output; and at least one transistor comprising at least one terminal and at least one isolated well. The input of the amplifier is electrically connected to the at least one terminal of the transistor; and the output of the amplifier is electrically connected to the at least one isolated well of the at least one transistor.

27 Claims, 6 Drawing Sheets

U.S. PATENT DOCUMENTS

| | | | | |
|---|---|---|---|---|
| 2006/0038607 | A1* | 2/2006 | Wada | 327/538 |
| 2006/0119451 | A1 | 6/2006 | Chen | |
| 2006/0176112 | A1 | 8/2006 | Nakatani et al. | |
| 2008/0180176 | A1* | 7/2008 | Lee | 330/297 |
| 2008/0272824 | A1* | 11/2008 | Fu et al. | 327/390 |
| 2010/0001351 | A1* | 1/2010 | Zhang et al. | 257/392 |

OTHER PUBLICATIONS

Z. Li et al., "A 15-GHz Integrated CMOS Switch with 21.5-dBm IP1dB and 1.8-dB Insertion Loss," VLSI Circuit Symposium Digest of Technical Papers, Jun. 2004, pp. 366-367.

Z. Li et al., "5.8-GHz CMOS T/R Switches With High and Low Substrate Resistances in a 0.18-μm CMOS Process," IEEE Microwave and Wireless Component Letters, Jan. 2003, pp. 1-3, vol. 13, No. 1.

K. Lee et al., "The Impact of Semiconductor Technology Scaling on CMOS RF and Digital Circuits for Wireless Application," IEEE Trans. Electron Devices, Jul. 2005, pp. 1415-1422, vol. 52, No. 7.

M.-C. Yeh et al., "Design and Analysis for a Miniature CMOS SPDT Switch Using Body-Floating Technique to Improve Power Performance," IEEE Transactions on Microwave Theory and Techniques, Jan. 2006, pp. 31-39, vol. 54, No. 1.

N.A. Talwalkar et al., "Integrated CMOS Transmit-Receive Switch Using LC-Tuned Substrate Bias for 2.4-GHz and 5.2-GHz Applications," IEEE Journal of Solid-State Circuits, Jun. 2004, pp. 863-870, vol. 39, No. 6.

H. Takasu et al., "W-Band SPST Transistor Switches," IEEE Microwave and Guided Wave Letters, Sep. 1996, pp. 315-316, vol. 6, No. 9.

S. Voldman et al., "Latchup in Merged Triple Well Structure," Proceedings of the 43rd Annual IEEE International Reliability Physics Symposium, Apr. 2005, pp. 129-136.

A. Poh et al., "Design and Analysis of Transmit/Receive Switch in Triple-Well CMOS for MIMO Wireless Systems," IEEE Transactions on Microwave Theory and Techniques, Mar. 2007, pp. 458-466, vol. 55, No. 3.

C. Barbier-Petot et al., "Substrate Isolation in 90nm RF-CMOS Technology," European Microwave Conference (EuMC), Oct. 2005, pp. 89-92.

* cited by examiner

S-PARAMETER RESPONSE

SWITCH WITH REDUCED INSERTION LOSS

CROSS-REFERENCE TO RELATED APPLICATION

This application claims the benefit of U.S. Provisional Application No. 60/949,685, filed Jul. 13, 2007, the disclosure of which is incorporated by reference herein.

STATEMENT REGARDING FEDERALLY SPONSORED RESEARCH OR DEVELOPMENT

The invention disclosed herein was made with U.S. Government support under Contract Nos. N66001-02-C-8014 and N66001-05-C-8013 awarded by the Defense Advanced Research Projects Agency (DARPA). The Government has certain rights in this invention.

FIELD OF THE INVENTION

The invention relates to the design and implementation of switches, and more specifically to the design and implementation of switches with reduced insertion loss.

BACKGROUND OF THE INVENTION

Traditionally, radio frequency (RF) switches at millimeter-wave (mmWave) frequencies are fabricated using GaAs metal epitaxial semiconductor field effect transistors (MESFETs) or PIN diodes, either as discrete components, or on a GaAs integrated circuit. But GaAs and other III-V semiconductor materials are more expensive than silicon and typically require higher supply voltages and consume more power then Si integrated circuits (ICs). Thus, it is desirable to produce an RF switch in Si with insertion loss comparable to GaAs devices.

However, it is difficult to produce a low insertion loss switch for radio frequency (RF) signals, especially at millimeter-wave (mmWave) frequencies, in a silicon complementary metal-oxide-semiconductor (CMOS) process because the silicon FETs and the silicon substrate itself are very lossy. Similar problems are associated with a silicon BiCMOS process in which CMOS devices and bipolar junction transistors (BJT) are integrated in a single device. For example, in the arrangement disclosed by U.S. Pat. No. 7,123,898, the disclosure of which is incorporated herein, elaborate circuits are used for biasing the gates of the field effect transistors (FETs) in a single-pull double-throw (SPDT) switch, but no arrangements are made for minimizing substrate-related losses.

SUMMARY OF THE INVENTION

An illustrative embodiment of the present invention includes a circuit comprising an amplifier having an input and an output; and at least one transistor comprising at least one terminal and at least one isolated well. The input of the amplifier is electrically connected to the at least one terminal of the transistor; and the output of the amplifier is electrically connected to the at least one isolated well of the at least one transistor.

Another illustrative embodiment of the present invention includes a design structure embodied in a machine readable medium, the design structure comprising an amplifier having an input and an output; and at least one transistor comprising at least one terminal and at least one isolated well. The input of the amplifier is electrically connected to the at least one terminal of the transistor; and the output of the amplifier is electrically connected to the at least one isolated well of the at least one transistor.

These and other objects, features and advantages of the present invention will become apparent from the following detailed description of illustrative embodiments thereof, which is to be read in connection with the accompanying drawings.

DETAILED DESCRIPTION

The present invention will be described herein in the context of an exemplary CMOS switch. Although illustrative embodiments of the present invention may be particularly well-suited for use in a high-frequency and/or millimeter-wave receiver or transceiver, illustrative embodiments of the present invention may be used in a variety of contexts, including a broad range of communications, radar, and radiometry applications.

It is therefore to be understood that the techniques of the present invention are not limited to the methods and apparatus shown and described herein. Rather, alternative methods and apparatus within the scope of this invention will become apparent to those skilled in the art given the teachings herein.

Figure 1:
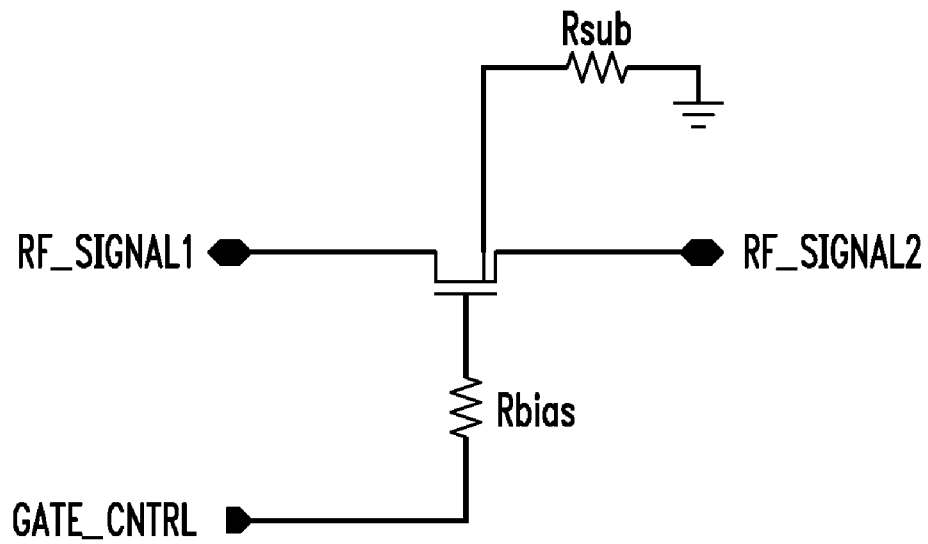
FIG. 1 shows a switch similar to that described in the prior art.

FIG. 1 shows an exemplary switch similar to that described in Z. Li et al., "5.8-GHz CMOS T/R Switches With High and Low Substrate Resistances in a 0.18-μm CMOS Process," IEEE Microwave and Wireless Component Letters, vol. 13, no. 1, pp. 1-3, Jan. 2003, the disclosure of which is incorporated by reference herein. This switch reduces the loss related to the gate capacitance of n-channel field effect transistor FET (through the channel and gate resistances) by including biasing resistor $R_{bias}$ in series with the gate terminal of the NFET. This allows the gate to follow the RF signal, increasing the effective shunt resistance seen by the signal. However, the loss related to the channel, source-, and drain-to-substrate capacitances (through the channel and substrate resistances) remains, and this component of loss can become significant at mmWave frequencies. More specifically, the insertion loss due to the source-, drain-, and channel-to-substrate capacitances varies depending on the effective value of substrate resistance $R_{sub}$, with loss decreasing as $R_{sub}$ increases. The substrate resistance depends on substrate resistivity and layout, but high-resistivity substrates which reduce the loss due to this mechanism are more expensive and exacerbate latch-up issues in CMOS.

Figure 2:
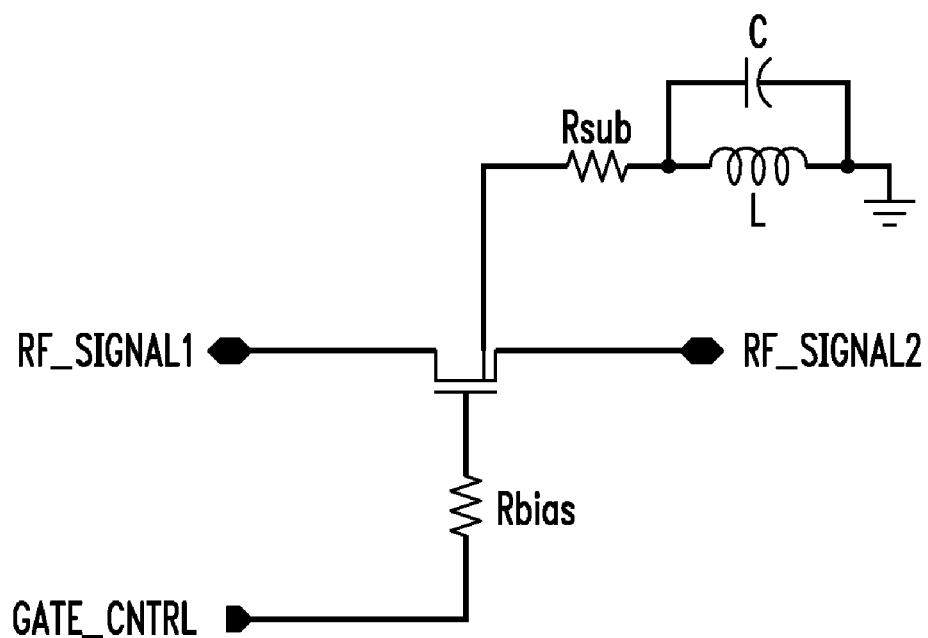
FIG. 2 shows another switch similar to that described in the prior art.

FIG. 2 shows an exemplary switch similar to that described in N. A. Talwalkar et al., "Integrated CMOS Transmit-Receive Switch Using LC-Tuned Substrate Bias for 2.4-GHz and 5.2-GHz Applications", *IEEE JSSC*, vol. 39, no. 4, pp. 863-870, June 2004, the disclosure of which is incorporated therein. As with the switch shown in FIG. 1, this switch includes biasing resistor $R_{bias}$ in series with the gate terminal of the NFET. Here, the effective substrate resistance $R_{sub}$ is increased by inserting a parallel resonant circuit, an LC tank comprising inductor L and capacitor C, in series with the substrate ground connection. This increases the effective substrate resistance at the frequency at which L and C resonate. However, this technique is limited by the quality-factor (Q) of on-chip inductor L.

In M.-C. Yeh et al., "Design and Analysis for a Miniature CMOS SPDT Switch Using Body-Floating Technique to Improve Power Performance", *IEEE MTT*, vol. 54, no. 1, pp. 31-39, January 2006, the disclosure of which is incorporated by reference herein, triple-well NFETs are used as series switches in a SPDT arrangement, and the P-wells under the NFET channels are allowed to float by biasing the P-wells through a relatively large (5 kΩ) resistor. However, as will be discussed in the context of FIG. 6, even if the P-well is left floating, there are still relatively large capacitances between the P-well and N-well, and between the N-well and substrate. These capacitances are significant at mmWave frequencies, and they couple the NFET source, drain, and channel to ground through the effective substrate resistance, which results in significant signal loss.

Figure 3:
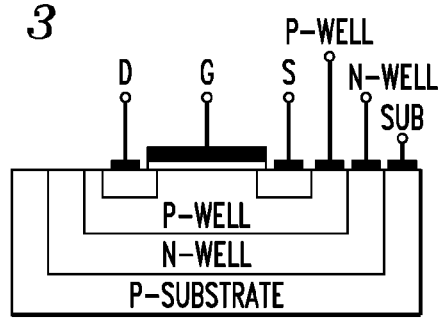
FIG. 3 is a cross-section of an exemplary triple-well NFET suitable for use in an illustrative embodiment of the present invention.
Figure 4:
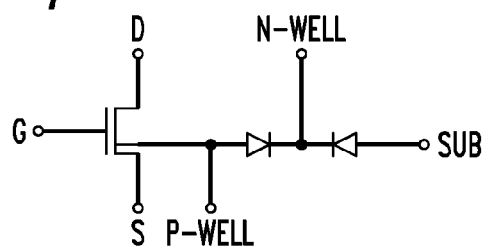
FIG. 4 is a schematic representation of the exemplary triple-well NFET shown in FIG. 3.

FIG. 3 is a cross-section of an exemplary "triple-well" or "deep N-well" NFET available in many advanced CMOS and BiCMOS processes and suitable for use in this invention. In a triple-well NFET, a deep N-well diffusion isolates the P-well (or bulk) under the gate or channel (G), drain (D), and source (S) terminals of the NFET from the P-substrate below, allowing both P-well and N-well to be biased or driven with a signal at potentials different from that of P-substrate. FIG. 4 is a schematic representation of the exemplary triple-well NFET shown in FIG. 3. Because the entire substrate need not be floated at the resonant frequency, greater flexibility may be achieved in reducing or eliminating the aforementioned switching loss.

Figure 5:
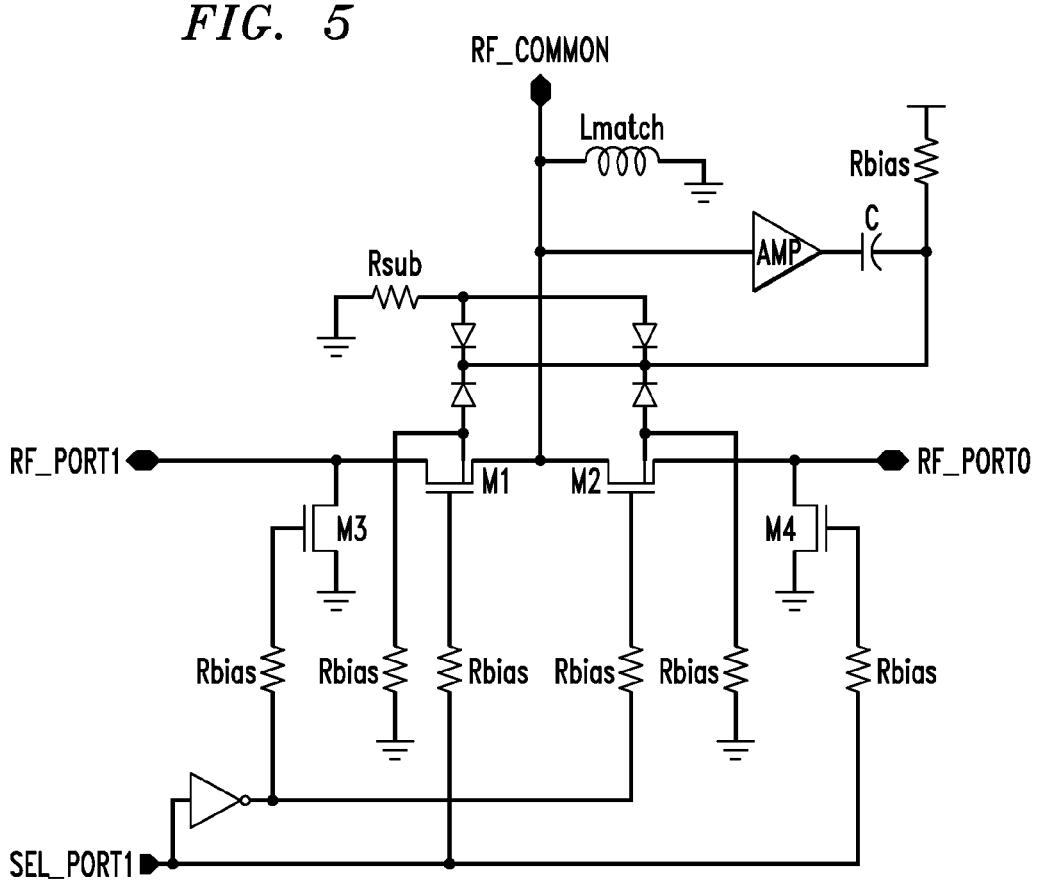
FIG. 5 shows an exemplary switching circuit according to an aspect of the present invention.

FIG. 5 is an exemplary single-pull, double-throw (SPDT) switching circuit according to an aspect of the present invention. Devices M1 and M2 are triple-well NFETs. Amplifier AMP drives the N-wells of M1 and M2 with a signal which is proportional to the voltage of the RF signal present at RF_COMMON. Thus, the potential of the N-wells under devices M1 and M2 follows the signal present at the source, drain, and channel terminals of M1 and M2, significantly reducing the lossy conduction through the channel-, source-, and drain-to-substrate capacitances and the channel and substrate resistances. Triple-well NFETs may be used for M3 and M4 as well as for M1 and M2. The use of triple-well NFETs for M3 and M4 advantageously reduces the insertion loss. However, the switch isolation is also reduced, and the buffer amplifier is also forced to drive a larger capacitive load.

Figure 6:
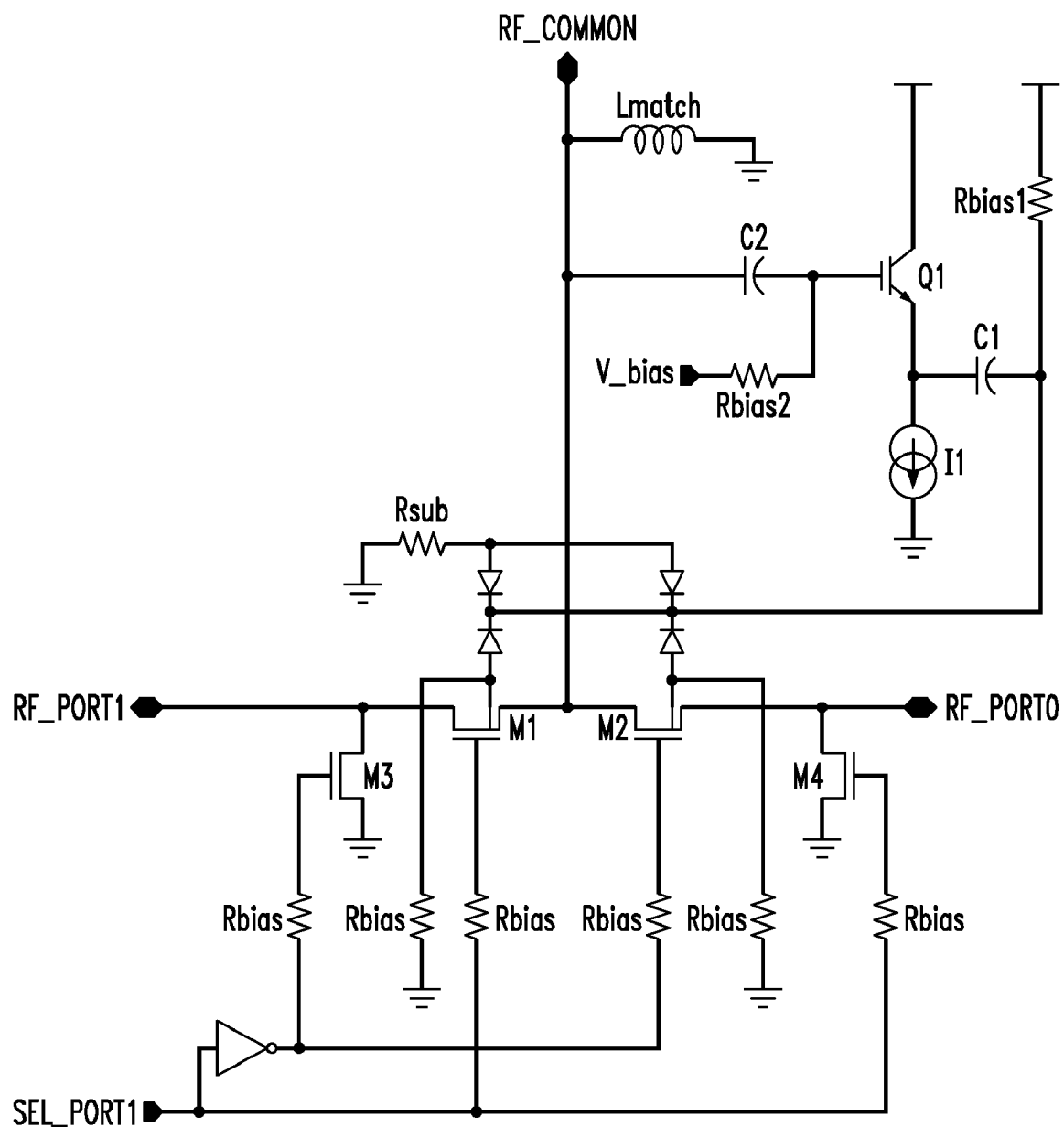
FIG. 6 shows a preferred embodiment in which the switch shown in FIG. 5 is implemented using a BiCMOS process.

FIG. 6 shows a preferred embodiment in which the switch shown in FIG. 5 is implemented using a 0.13 μm SiGe BiCMOS process. A bipolar junction transistor (BJT) is used in an emitter-follower configuration to implement the buffer amplifier, which is biased at 1.5 mA from a 2.7-V supply (4 mW power consumption). The CMOS devices (including triple-well NFET switches M1 and M2) are operated from a 1.5-V supply. The buffer amplifier preferably has a gain of approximately 0.85 at 60 GHz, which results in an insertion loss of 1.3 dB at 60 GHz. Biasing resistors $R_{bias}$ and $R_{bias1}$ each have a resistance of 10 kΩ, biasing resistor $R_{bias2}$ has a resistance of 5 kΩ, inductor $L_{match}$ has an inductance of 250 pH, and capacitors $C_1$ and $C_2$ each have a capacitor of 200 fF. Without the buffer amplifier, the insertion loss of the SPDT switch is >3 dB. In other embodiments, the amplifier could be a source follower and/or the transistor could be a component within a double-pull double-throw switch.

Figure 7:
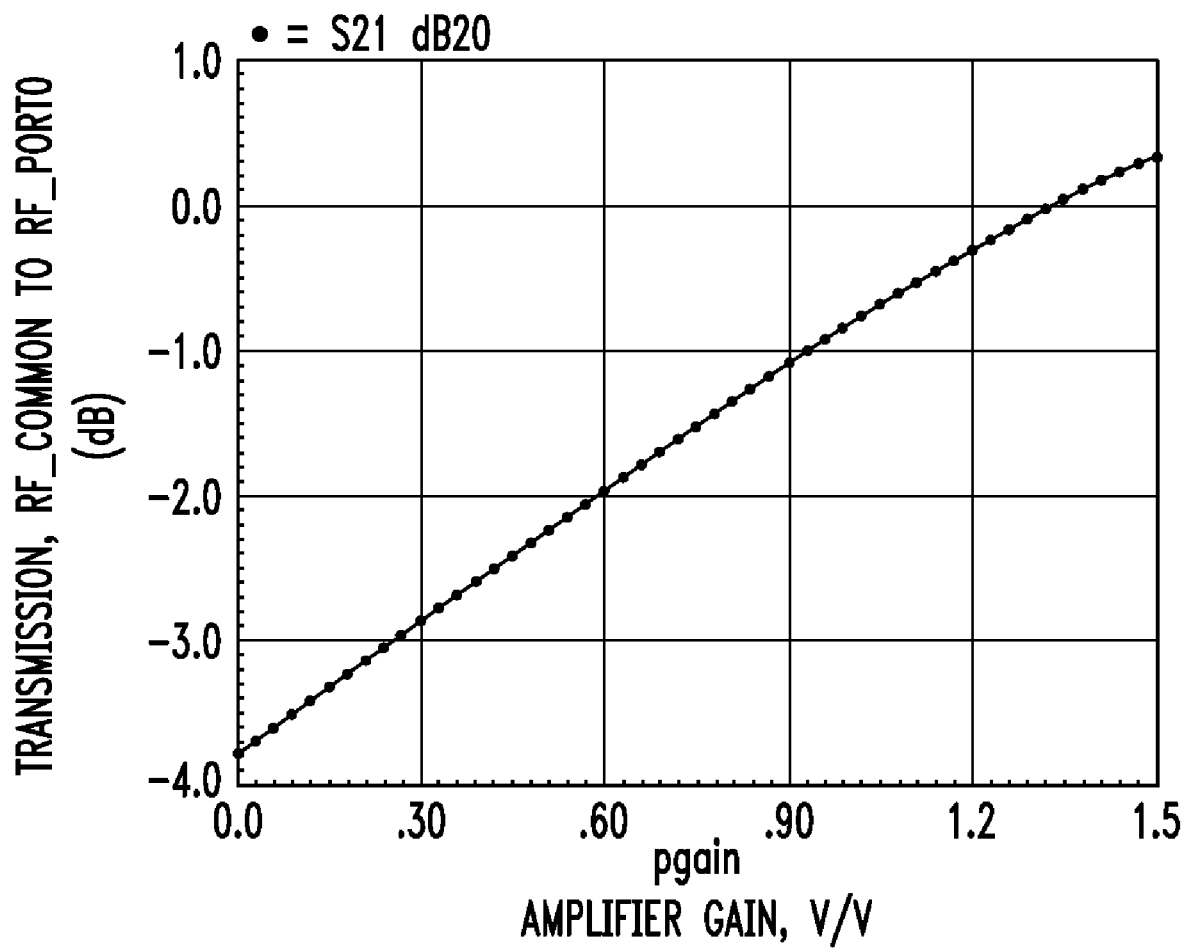
FIG. 7 shows a simulation of the signal transmission of the circuit in FIG. 6.

FIG. 7 shows a simulation of the signal transmission (S21) in dB of the circuit in FIG. 6 from an input signal at RF_COMMON to an output signal at RF_PORT0, as a function of the amplifier gain. With no amplifier, and assuming a substrate resistance $R_{sub}$ of 50Ω, the insertion loss of the SPDT switch shown in FIG. 5 is >3 dB. With an amplifier gain of 0.9, the insertion loss drops to 1.1 dB, and with an amplifier gain of 1, the insertion loss is <1 dB. With amplifier gains of 1.3 or more, the switch can actually have insertion gain instead of insertion loss. However, it is most practical from a standpoint of circuit complexity and power consumption to implement a simple buffer amplifier with high input impedance and a gain less than unity (a voltage follower).

Figure 8:
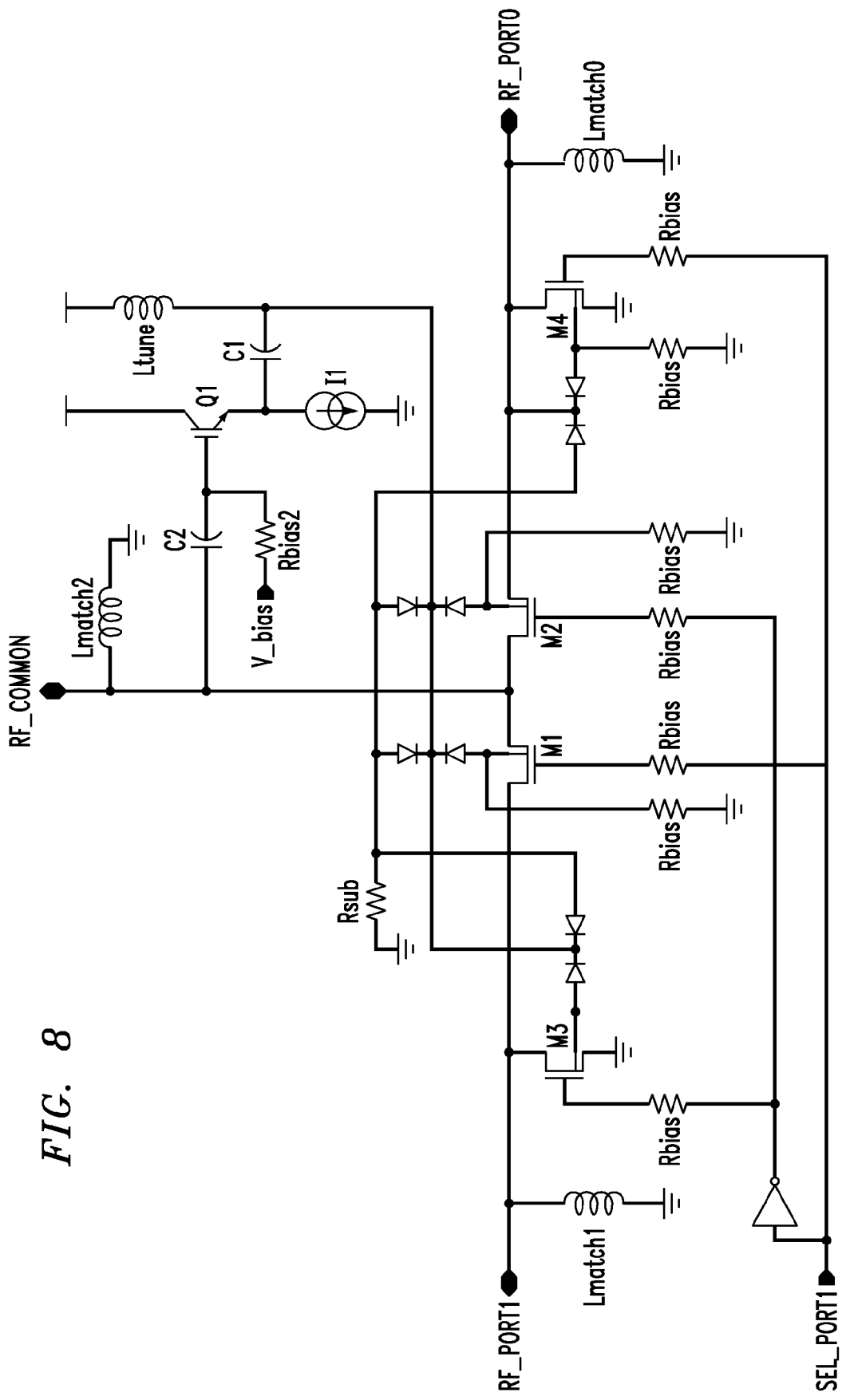
FIG. 8 shows an exemplary switching circuit according to a further aspect of the invention.

FIG. 8 shows an exemplary switching circuit according to a further aspect of the invention. The circuit shown in FIG. 8 is similar to the circuit shown in FIG. 6. However, matching inductors $L_{match0}$, $L_{match1}$, $L_{match2}$ are included at all RF ports, not just at RF_COMMON. These matching inductors are used to tune out the effective shunt capacitance of NFET switches M1, M2, M3 and M4 at the operating frequency of 60 GHz, thereby providing a good impedance match in a 50-Ω system. The use of three inductors instead of one can provide better impedance matching and increased isolation, at the expense of increased circuit area. Of course, many other impedance matching schemes (such as series inductors instead of shunt inductors, etc.) could be also used within illustrative embodiments of the invention.

Also, a resonant load is used for the amplifier as shown by the inclusion of inductor $L_{tune}$, which is selected to resonate with the total effective shunt capacitance of the driven N-wells at the operating frequency of 60 GHz. This therefore tunes out the shunt capacitance at the operating frequency, increasing the load impedance seen by the amplifier, and thereby increasing the amplifier gain.

The preferred embodiments of the present invention heretofore described use Negative-channel Field Effect Transistor (NFET) devices rather than Positive-channel Field Effect Transistor (PFET) devices. It is generally preferable to use NFETs for RF switches than PFETs because PFETs have lower transconductance than NFETs; the lower PFET transconductance results in a switch which has higher on-state resistance and higher insertion loss. However, illustrative embodiments of the present invention may incorporate PFETs in addition to or instead of NFETs. Although the exemplary circuits described herein would require modification to allow for correct biasing of the PFET wells, such modification would be within the scope of one having skill in the art. For example, one could use an active amplifier to drive the n-well of an ordinary PFET or one of the wells of a triple-well PFET to reduce the insertion loss of the PFET switch.

At least a portion of the circuit of the present invention may be implemented in an integrated circuit. In forming integrated circuits, a plurality of identical die is typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

Figure 9:
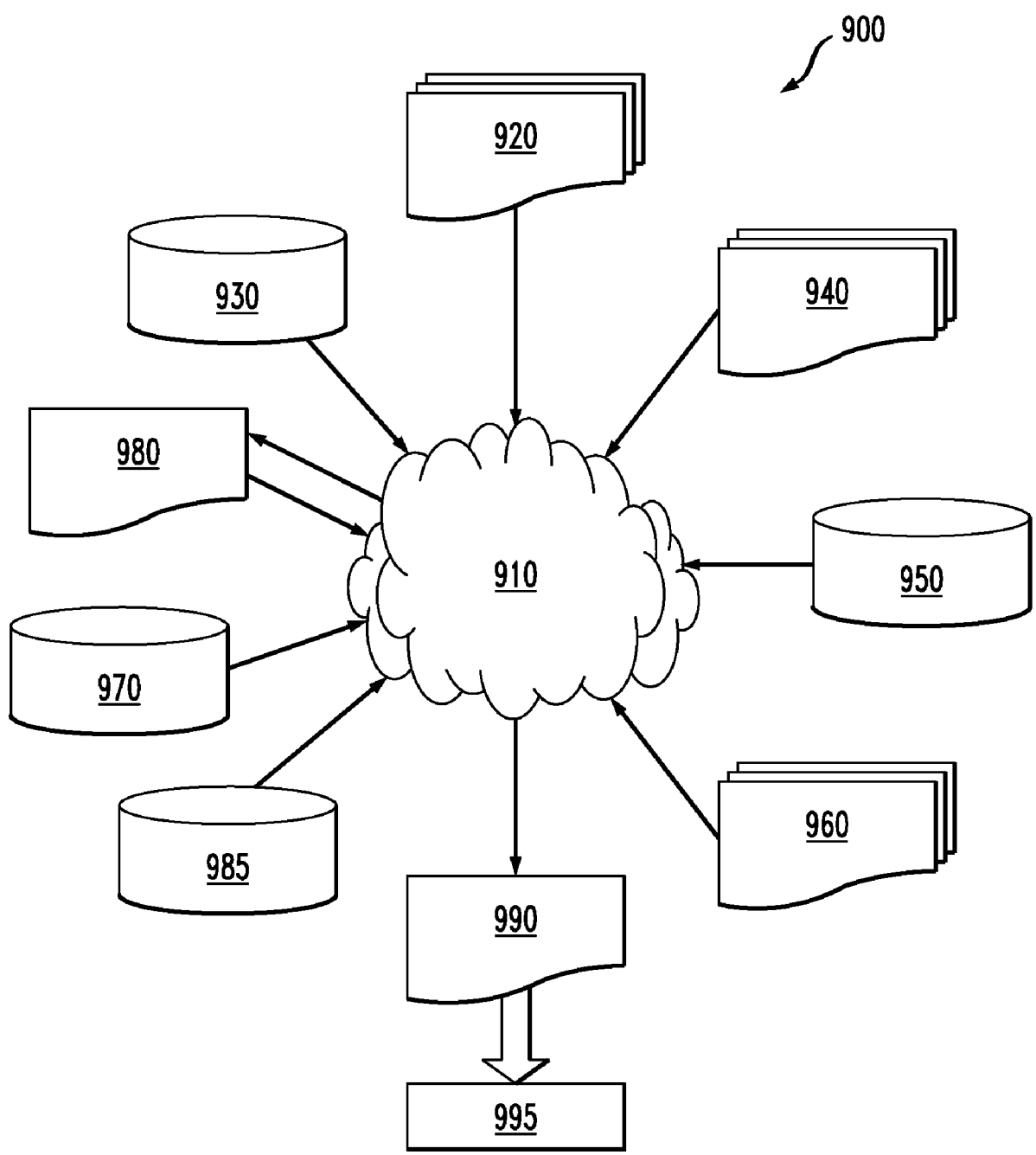
FIG. 9 is a flow diagram of a design process used in semiconductor design, manufacture, and/or test.

FIG. 9 shows a block diagram of an exemplary design flow 900 used for example, in semiconductor design, manufacturing, and/or test. Design flow 900 may vary depending on the type of integrated circuit (IC) being designed. For example, a design flow 900 for building an application specific IC (ASIC) may differ from a design flow 900 for designing a standard component. Design structure 920 is preferably an input to a design process 910 and may come from an IC provider, a core developer, or other design company or may be generated by the operator of the design flow, or from other sources. Design structure 920 may comprise an embodiment of the invention as shown in FIGS. 5, 7 and/or 8 in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the invention as shown in FIGS. 5, 7 and/or 8. Design process 910 preferably synthesizes (or translates) an embodiment of the invention as shown in FIGS. 5, 6 and/or 8 into a netlist 980, where netlist 980 is, for example, a list of wires, transistors, logic gates, control circuits, I/O, models, etc. that describes the connections to other elements and circuits in an integrated circuit design and recorded on at least one of machine readable medium. This may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIGS. 5, 6 and/or 8, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 5, 6 and/or 8. Design structure 990 may then proceed to a stage 995 where, for example, design structure 990: proceeds to tape-out, is released to manufacturing, is released to a mask house, is sent to another design house, is sent back to the customer, etc.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A circuit comprising:
an amplifier having an input and an output; and
at least one transistor formed on at least one substrate, the at least one transistor comprising:
at least one terminal; and
at least a first well and a second well;
wherein the at least first and second wells are electrically isolated from the at least one substrate;
wherein the at least second well is electrically isolated from the at least first well;
wherein the input of the amplifier is electrically connected to the at least one terminal of the at least one transistor; and
wherein the output of the amplifier is electrically connected to the at least first well of the at least one transistor.

2. The circuit of claim 1, wherein the at least one transistor is a component of a switch.

3. The circuit of claim 2, wherein the at least one terminal comprises an input terminal of the switch.

4. The circuit of claim 2, wherein the at least one terminal comprises an output terminal of the switch.

5. The circuit of claim 2, further comprising impedance-matching inductors added to at least one of an input and an output of the switch.

6. The circuit of claim 2, wherein the switch is a radio frequency switch.

7. The circuit of claim 1, wherein the transistor is a component of a single-pull double-throw switch.

8. A circuit comprising:
an amplifier having an input and an output; and
at least one transistor formed on at least one substrate, the at least one transistor comprising:
at least one terminal; and
at least a first well and a second well;
wherein the at least first and second wells are electrically isolated from the at least one substrate;
wherein the at least second well is electrically isolated from the at least first well;
wherein the input of the amplifier is electrically connected to the at least one terminal of the at least one transistor;
wherein the output of the amplifier is electrically connected to the at least first well of the at least one transistor; and
wherein the circuit further comprises at least one coupling capacitor electrically connected between the input of the amplifier and the at least one terminal of the transistor.

9. A circuit comprising:
an amplifier having an input and an output; and
at least one transistor formed on at least one substrate, the at least one transistor comprising:
at least one terminal; and
at least a first well and a second well;
wherein the at least first and second wells are electrically isolated from the at least one substrate;
wherein the at least second well is electrically isolated from the at least first well;
wherein the input of the amplifier is electrically connected to the at least one terminal of the at least one transistor;

wherein the output of the amplifier is electrically connected to the at least first well of the at least one transistor; and wherein the circuit further comprises at least one impedance-matching inductor electrically connected between the input of the amplifier and the at least one terminal of the transistor.

10. A circuit comprising:
an amplifier having an input and an output; and
at least one transistor formed on at least one substrate, the at least one transistor comprising:
at least one terminal; and
at least a first well and a second well;
wherein the at least first and second wells are electrically isolated from the at least one substrate;
wherein the at least second well is electrically isolated from the at least first well;
wherein the input of the amplifier is electrically connected to the at least one terminal of the at least one transistor;
wherein the output of the amplifier is electrically connected to the at least first well of the at least one transistor; and
wherein the circuit further comprises at least one coupling capacitor electrically connected between the output of the amplifier and the at least first well of the transistor.

11. A circuit comprising:
an amplifier having an input and an output; and
at least one transistor formed on at least one substrate, the at least one transistor comprising:
at least one terminal; and
at least a first well and a second well;
wherein the at least first and second wells are electrically isolated from the at least one substrate;
wherein the at least second well is electrically isolated from the at least first well;
wherein the input of the amplifier is electrically connected to the at least one terminal of the at least one transistor;
wherein the output of the amplifier is electrically connected to the at least first well of the at least one transistor; and
wherein the circuit further comprises at least one impedance-matching inductor electrically connected between the output of the amplifier and the at least first well of the transistor.

12. A circuit comprising:
an amplifier having an input and an output; and
at least one transistor formed on at least one substrate, the at least one transistor comprising:
at least one terminal; and
at least a first well and a second well;
wherein the at least first and second wells are electrically isolated from the at least one substrate;
wherein the at least second well is electrically isolated from the at least first well;
wherein the input of the amplifier is electrically connected to the at least one terminal of the at least one transistor;
wherein the output of the amplifier is electrically connected to the at least first well of the at least one transistor; and
wherein the input of the amplifier has a significantly higher impedance than the output of the amplifier.

13. The circuit of claim 1, wherein the amplifier comprises an active amplifier.

14. The circuit of claim 1, wherein the amplifier comprises a bipolar junction transistor (BJT).

15. The circuit of claim 1, wherein the amplifier is an emitter follower.

16. The circuit of claim 1, wherein the at least one transistor comprises at least one negative field effect transistor.

17. A circuit comprising:
an amplifier having an input and an output; and
at least one transistor formed on at least one substrate, the at least one transistor comprising:
at least one terminal; and
at least a first well and a second well;
wherein the at least first and second wells are electrically isolated from the at least one substrate;
wherein the at least second well is electrically isolated from the at least first well;
wherein the input of the amplifier is electrically connected to the at least one terminal of the at least one transistor;
wherein the output of the amplifier is electrically connected to the at least first well of the at least one transistor; and
wherein the at least one transistor comprises at least one positive field effect transistor.

18. A design structure embodied in a machine readable storage medium, the design structure comprising:
an amplifier having an input and an output; and
at least one transistor formed on at least one substrate, the at least one transistor comprising:
at least one terminal; and
at least a first well and a second well;
wherein the at least first and second wells are electrically isolated from the at least one substrate;
wherein the at least second well is electrically isolated from the at least first well;
wherein the input of the amplifier is electrically connected to the at least one terminal of the at least one transistor; and
wherein the output of the amplifier is electrically connected to the at least first well of the at least one transistor.

19. A design structure embodied in a machine readable storage medium, the design structure comprising:
an amplifier having an input and an output; and
at least one transistor formed on at least one substrate, the at least one transistor comprising:
at least one terminal; and
at least a first well and a second well;
wherein the at least first and second wells are electrically isolated from the at least one substrate;
wherein the at least second well is electrically isolated from the at least first well;
wherein the input of the amplifier is electrically connected to the at least one terminal of the at least one transistor;
wherein the output of the amplifier is electrically connected to the at least first well of the at least one transistor; and
wherein the amplifier comprises a bipolar junction transistor (BJT).

20. The design structure of claim 18, wherein the amplifier is an active amplifier.

21. The circuit of claim 1, wherein the at least one transistor comprises at least one triple-well field effect transistor.

22. The circuit of claim 1, wherein the at least first well comprises at least one isolated well of the at least one transistor.

23. The circuit of claim 1, wherein the at least second well comprises at least one bulk well of the at least one transistor.

24. The circuit of claim 1, wherein the at least second well is disposed between the at least one terminal and the at least first well.

25. The circuit of claim 1, wherein the at least one terminal is electrically isolated from the at least first and second wells.

26. The circuit of claim 1, wherein a potential of the at least first well follows a signal present at the at least one terminal.

27. The circuit of claim 1, wherein the at least one terminal comprises at least one of a source and a drain.

* * * * *